United States Patent [19]

Tanikoshi

[11] Patent Number: 5,412,340
[45] Date of Patent: May 2, 1995

[54] SHIELD STRUCTURE FOR USE IN MICROWAVE CIRCUIT DEVICE

[75] Inventor: Sadao Tanikoshi, Tokyo, Japan

[73] Assignee: Kabushiki Kaisha Toshiba, Kawasaki, Japan

[21] Appl. No.: 151,187

[22] Filed: Nov. 12, 1993

[30] Foreign Application Priority Data

Nov. 16, 1992 [JP] Japan ................................. 4-304288

[51] Int. Cl.⁶ ............................................. H03F 3/19
[52] U.S. Cl. ...................................... 330/68; 361/816; 455/300
[58] Field of Search .............................. 330/65, 66, 68; 174/35 TS; 361/800, 816, 817, 818, 820; 455/300, 301

[56] References Cited

U.S. PATENT DOCUMENTS 5,095,616  3/1992  Veenendaal .
5,150,282  9/1992  Tomura et al. ................. 455/300 X
5,265,273  11/1993  Goodwin et al. .............. 455/301 X

FOREIGN PATENT DOCUMENTS 55-150255  11/1980  Japan .
208726  9/1987  Japan ................... 455/300
63-220601  9/1988  Japan .
1-308096  12/1989  Japan ................... 361/800
1-314408  12/1989  Japan .

OTHER PUBLICATIONS

"Noise Reduction Techniques In Electronic Systems", Henry W. Ott, 1988, pp. 192-203.

Primary Examiner—James B. Mullins
Attorney, Agent, or Firm—Oblon, Spivak, McClelland, Maier & Neustadt

[57] ABSTRACT

The present invention provides a shield structure for shielding a microwave circuit device, which can establish a reliable electric contact between the ground wiring patterns of a circuit substrate, and can completely prevent external noise from entering into the circuit, with the use of a light and compact shield case. A circuit substrate has microwave components mounted thereon, ground patterns formed on peripheral portions of the upper surface of the substrate, and a ground pattern formed in the lower surface of the substrate along the entire periphery thereof. A shield case main body receiving the circuit substrate comprises a case main body, a top plate, and a bottom plate. The thickness of the case main body increases from a predetermined position such that it contacts the ground patterns. The bottom plate is coupled integral with the case main body with the circuit substrate interposed therebetween, in a state where the circuit substrate is received in the body. The shield case bottom plate has a surface, which is opposed to the lower surface of the circuit substrate and has a continuous groove formed therein along the periphery thereof. A shield line, which consists of an elastic conductor with a diameter greater than the depth of the groove, fills the continuous groove. The top plate is coupled integral with the upper surface of the shield case main body.

12 Claims, 7 Drawing Sheets

SHIELD STRUCTURE FOR USE IN MICROWAVE CIRCUIT DEVICE

BACKGROUND OF THE INVENTION

1. Field of the Invention

This invention relates to a microwave circuit device obtained by forming a microwave circuit on a substrate, and more particularly to an improved shield structure for shielding an circuit from external radio noise.

2. Description of the Related Art

First, a conventional shield structure employed in, for example, a microwave amplifier for amplifying a signal having a high frequency of several GHz—ten and several GHz will be explained with reference to FIGS. 1A and 1B.

Figure 1A:
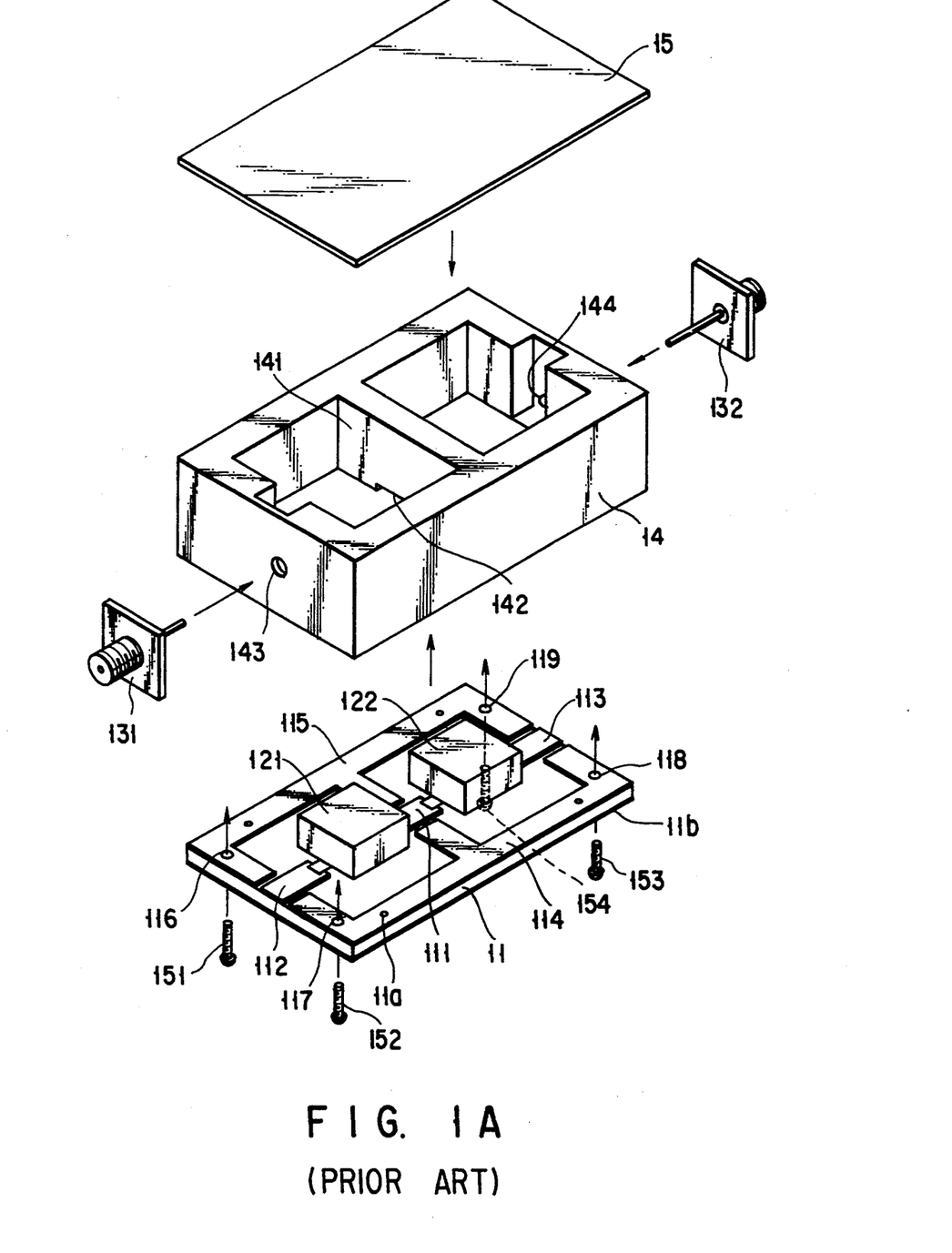
FIG. 1A is an exploded perspective view of the microwave amplifier.
Figure 1B:
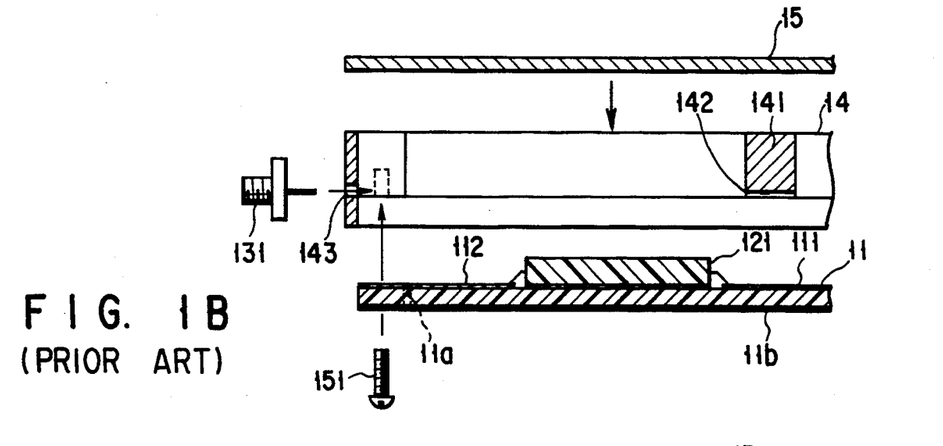
FIG. 1B is an exploded sectional side view, showing part of the microwave amplifier.

FIG. 1A is an exploded perspective view of a microwave amplifier, and FIG. 1B a cross sectional view showing part of the exploded cross section of the amplifier.

In FIGS. 1A and 1B, reference numeral 11 denotes a circuit substrate, which has an upper surface divided into two portions. Integrated circuit devices 121 and 122 for amplifying microwave (hereinafter called "IC component") are provided on central portions of the divided two surface portions, respectively.

On the upper surface of the substrate 11, the output terminal of the IC component 121 and the input terminal of the IC component 122 are connected to a wiring pattern 111 by means of solder, and are thus connected to each other in series. The input terminal of the IC component 121 and the output terminal of the IC component 122 are respectively connected to wiring patterns 112 and 113 by means of solder, which patterns are to be connected to the hot terminals of coaxial connectors 131 and 132, respectively.

The circuit substrate 11 further has ground patterns 114 and 115 formed on peripheral portions of the upper surface, and a ground conductive layer 11b formed on the overall lower surface, hereinafter referred to as a "ground layer". The upper-surface-side patterns 114 and 115 are connected to the lower-surface-side ground layer 11b by means of a through hole 11a formed in a desired portion of the substrate 11.

The ground terminal of each of the IC components 121 and 122 is connected to the ground patterns 114 and 115. Screw holes 116–119 are formed in four corners of the circuit substrate 11.

The circuit substrate 11 further has microwave components such as a resistor, etc., and wiring patterns for connecting the components. These components and patterns are not explained and shown, for simplifying the explanation of the shield structure.

A shield case for shielding the substrate 11 comprises a case main body 14, and a cover 15 for covering the upper surface of the case main body 14. The body 14 and the cover 15 are made of a conductive member (e.g. aluminum member).

The thickness of the case main body 14 increases from a predetermined portion thereof, such that it can be brought into electrical contact with the ground patterns 114 and 115 formed on peripheral portions of the substrate 11, in a state where the substrate 11 is inserted into the body 14 from the bottom and fixed to an intermediate portion thereof. Those portions of the ground patterns 114 and 115 of the substrate 11 which contact the case main body 14 are not coated with a resist for preventing corrosion.

Further, a partition plate 141 is formed integral with the case main body 14 at the center thereof, for shielding the IC components 121 and 122 from each other. A groove 142 is formed in a bottom central portion of the partition plate 141 so as to prevent the plate 141 from contacting the wiring pattern 111 on the upper surface of the substrate 11.

Through holes 143 and 144 are formed in those portions of the case main body 14 to which the coaxial connectors 131 and 132, for inserting therethrough the hot terminals of the connectors.

Peripheral surface portions of the connectors 131 and 132 serve as ground electrodes, and their central portions serve as hot electrodes. The hot electrodes are connected to pin terminals, which serve as hot terminals.

The connectors 131 and 132 are screwed to the case main body 14 without permitting their hot terminals to contact the inner surfaces of the through holes 143 and 144 (this state is not shown). Thus, peripheral portions of the connectors 131 and 132, the case main body 14, the cover 15, and the ground pattern 114 of the circuit substrate 11 are electrically connected to the lower-surface-side ground layer, and are kept at the ground potential.

The portions of the case main body 14 to which the connectors 131 and 132 are attached are made thinner than the other portions, and the hot terminals of the connectors 131 and 132 which project from the holes 143 and 144 are soldered to the patterns 112 and 113 of the substrate 11, respectively. As a result, the hot terminal of the connector 131 functions as a microwave signal input terminal, and that of the connector 132 as a microwave signal output terminal.

The substrate 11 is screwed to the case main body 14 by means of screws 151–154 from the bottom of the body 14, and the cover 15 is adhered to the upper surface of the body 14 by the use of a shield resin.

No explanations will be given of a power supply system for the circuit substrate 11, so as to simplify the explanation of the device.

Since the IC components 121 and 122 are surrounded with conductive members, they can be shielded from external radio noise.

Figure 2:
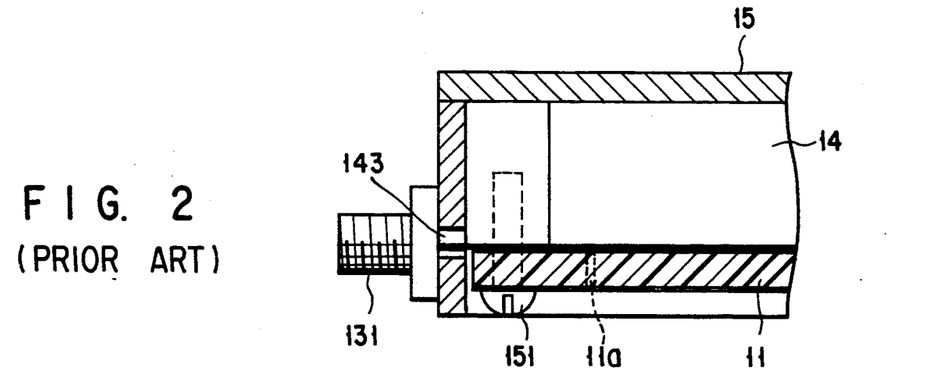
FIG. 2 is a cross sectional view, useful in explaining the drawbacks of a shield structure shown in FIGS. 1A and 1B, and showing part of the microwave amplifier having been assembled.

In the case of the above-described shield structure, however, when it is actually assembled, a clearance may inevitably be formed due to a warped portion of the substrate 11 and/or uneven surface portions of the ground patterns 114 and 115, as is shown in FIG. 2. External radio noise can enter into the circuit through the clearance, thereby, for example, reducing the ratio of the level of a signal to that of noise.

Moreover, since uneven surface portions of the ground patterns 114 and 115 increase the contact resistances between them and the case main body 14, a potential difference may be caused between the substrate 11 and the shield case, thereby degrading the characteristics of the circuit.

To avoid this, insertion of a conductive rubber between the patterns 114 and 115 of the substrate 11 is employed as a conventional technique. This technique, however, may increase the contact resistances of the patterns 114 and 115 since the contact resistance of a conductive rubber is ten times higher than that of a metal. Further, the conductive rubber will have its quality degraded or cracked after long use, reducing the life of the circuit device. In particular, when the rubber is cracked, external radio noise enters into the circuit, thereby reducing the ratio of the level of a signal to that of noise.

Figure 3:
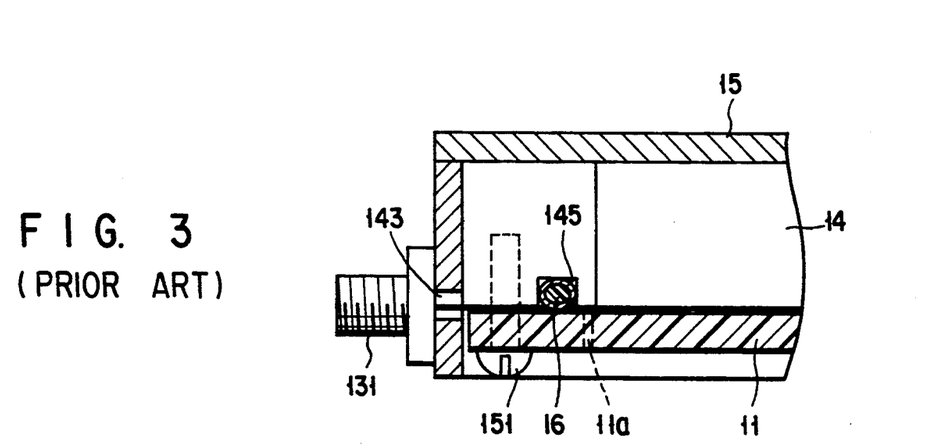
FIG. 3 is a sectional side view, showing another conventional shield structure for the microwave amplifier.

FIG. 3 shows another shield structure. In this case, a groove 145 is formed in the surface portion of the case main body 14 which contacts the circuit substrate 11, and is filled with a shield line 16 made of an elastic conductive member (which consists, for example, of a cable made of an elastic resin member and threads made of copper or aluminum and wound on the cable). The diameter of the shield line 16 is set greater than the depth of the groove 145.

In the above structure, when the substrate 11 is screwed to the case main body 14, the shield line 16 is pressed against the ground patterns 114 and 115 of the substrate 11 and the base main body 14, thereby filling the space between the patterns 114 and 115 and the base main body 14.

However, since the groove 145 to be filled with the shield line 16 is formed in the shield structure such that it does not pass the screw holes, the shield structure must be made thick. This being so, the shield case must be made large and heavy.

In addition, the shield line 16 cannot pass that portion of the circuit substrate 11 at which the wiring patterns 112 and 113 are formed. Therefore, the line 16 must be divided into two portions such that it does not contact the patterns 112 and 113. As a result, not only the man-hour of assembly is increased, but also there is a possibility of radio noise entering into the circuit from a portion at which the shield line 16 is not provided.

SUMMARY OF THE INVENTION

As described above, in the case of the conventional shield structure for shielding a microwave circuit device, a clearance may inevitably be formed between a circuit substrate and a shield case due to a warped portion or an uneven surface portion of the substrate, and external radio noise can enter into the circuit through the clearance, thereby reducing the ratio of the level of a signal to that of noise.

So as to eliminate the disadvantage, there have been devised various methods, for example, a method for inserting a conductive rubber member between the substrate and the shield case, and a method for filling a shield line in a groove formed in that portion of the shield case which contact the substrate. These methods, however, cannot completely prevent radio noise from entering into the circuit, and inevitably increase the number of assembling steps, the outer size and the weight.

It is the object of the invention to provide a shield structure for shielding a microwave circuit device, which can establish a reliable electric contact between the ground patterns of a circuit substrate, and can completely prevent external noise from entering into the circuit, with the use of a light and compact shield case.

To attain the object, there is provided a shield structure for shielding a microwave circuit device, comprising:

a circuit substrate having microwave components mounted thereon, and one of a ground layer formed on an lower surface of the substrate and a continuous ground pattern formed in the lower surface along the periphery thereof;

a shield case main body receiving the circuit substrate in an intermediate position of the body, the thickness of the shield case main body increasing from a predetermined position;

a shield case bottom plate coupled integral with the shield case main body with the circuit substrate interposed therebetween in a state where the circuit substrate is received in the body, the shield case bottom plate having a surface, which is opposed to the lower surface of the circuit substrate and has a continuous groove formed therein along the entire periphery thereof;

a shield line consisting of an elastic conductor with a diameter greater than the depth of the groove of the shield case bottom plate, and filling the continuous groove; and a shield case top plate coupled integral with the shield case main body.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B show a conventional microwave amplifier; wherein

FIGS. 4A, 4B and 4C show the structure of a microwave amplifier as a microwave circuit according to an embodiment of the invention; wherein

FIGS. 7A and 7B show the structure of a microwave amplifier according to a further embodiment of the invention; wherein

DETAILED DESCRIPTION OF THE PREFERRED EMBODIMENTS

The embodiments of the invention will be explained with reference to the accompanying drawings.

Figure 4A:
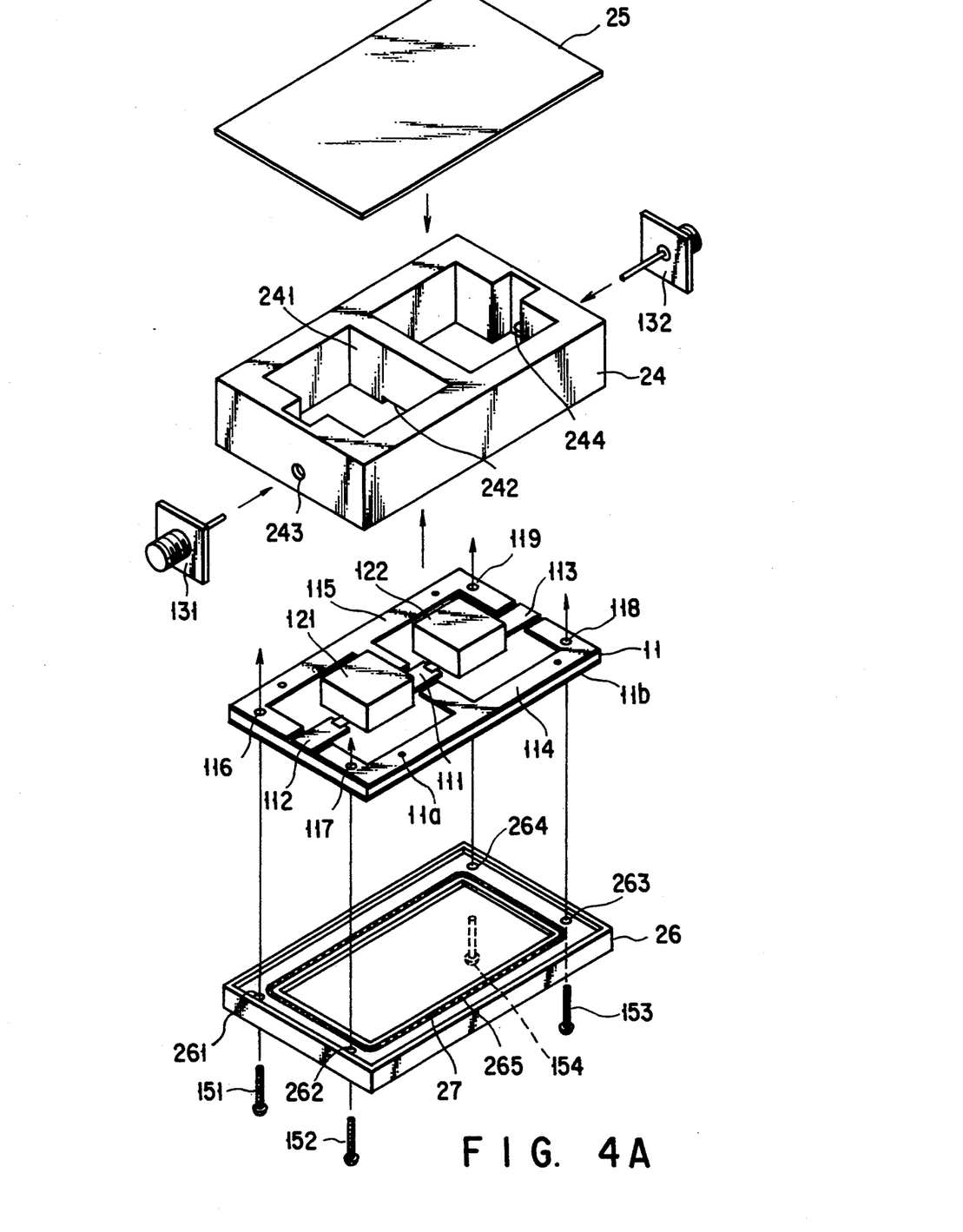
FIG. 4A is an exploded perspective view.
Figure 4B:
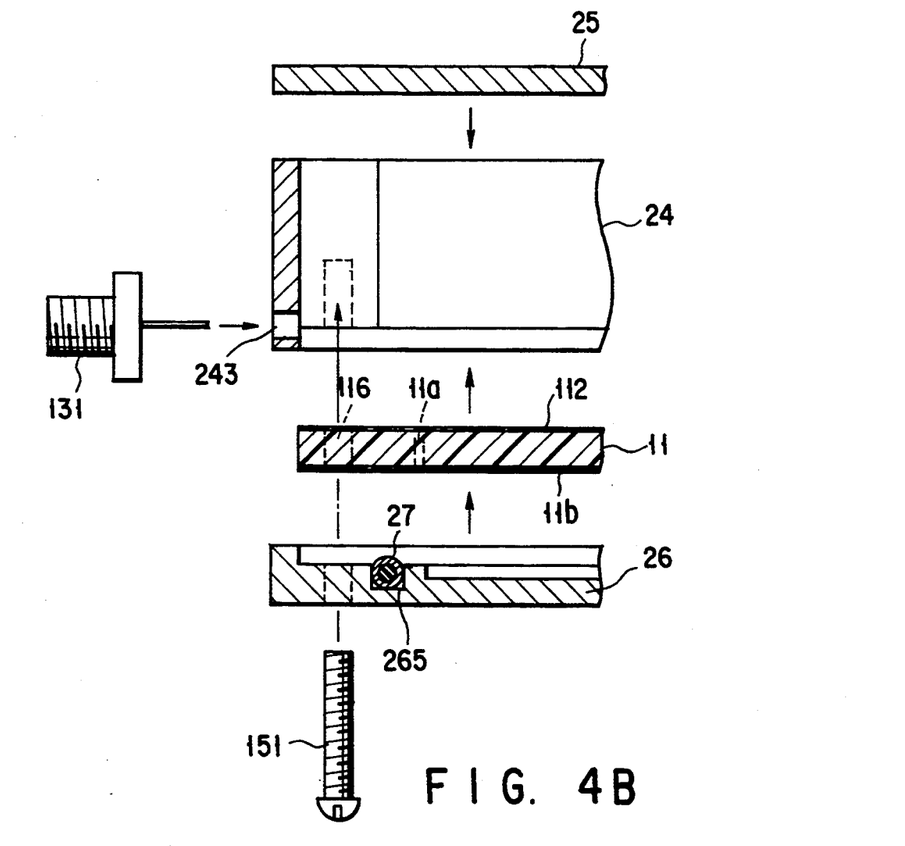
FIG. 4B is an exploded sectional side view of the microwave amplifier of FIG. 4A.

FIGS. 4A and 4B show the structure of a microwave amplifier as a microwave circuit according to an embodiment of the invention; wherein FIG. 4A is an exploded perspective view, and FIG. 4B is an exploded sectional side view. In FIGS. 4A and 4B, a circuit substrate, components mounted on the substrate and coaxial connectors have the same structures as the circuit substrate 11, the components 121 and 122 and the coaxial connectors 131 and 132 shown in FIGS. 1A and 1B.

Therefore, elements similar to those shown in FIGS. 1A and 1B are denoted corresponding reference numerals, and no explanations will be given of them.

The shield case employed in this embodiment comprises a case main body 24 constituting a side surface of the shield case, a top plate 25 for covering the upper surface of the body 24, and a bottom plate 26 for covering the bottom surface of the body 24. These body and plates are made of a conductive material (such as aluminum).

The thickness of the case main body 24 is increased from a predetermined portion thereof, such that it can be brought into electrical contact with ground patterns 114 and 115 formed on peripheral portions of the substrate 11, in a state where the substrate 11 is inserted into the body 24 from the bottom and fixed to an intermediate portion thereof. The thickness is set to such a value as enables the substrate 11 to be screwed to the main body 24.

Further, a partition plate 241 is formed integral with the case main body 14 as one body at the center thereof, for shielding the IC components 121 and 122 from each other. A groove 242 is formed in a bottom central portion of the partition plate 241 so as to prevent the plate 241 from contacting the wiring pattern 111 on the upper surface of the substrate 11.

Further, those portions of the case main body 24, to which the coaxial connectors 131 and 132 are attached, are thinner than other portions, and are provided with through holes 243 and 244 for inserting therethrough the hot terminals of the connectors 131 and 132.

The bottom plate 26 has the same outer size as the case main body 24, and the periphery of the plate 26 projects such that it can contact a lower portion of the outer periphery of the circuit substrate 11 and the periphery of the case main body 24. Further, the periphery of the bottom plate 26 has a width sufficient to contact the lower-surface-side periphery of the substrate 11, and to form screw holes 261–264 and a continuous groove 265 for burying a shield line therein.

The screw holes 261–264 are aligned with the screw holes 116–119 of the substrate 11. The continuous groove 265 extends along the four sides of the bottom plate 26. A shield line 27 is buried in the overall groove 265. The line 27 is formed of an elastic conductive member, which consists of a cable made of e.g. an elastic resin, and threads made of aluminum and wound on the cable. The line 27 has a diameter slightly greater than the depth of the groove 265.

The bottom plate 26 constructed as above is screwed to the case main body 24 by means of screws 151–154, with the circuit substrate 11 interposed therebetween. The coaxial connectors 131 and 132 are screwed to the body 24 such that their hot terminals do not contact the through holes 243 and 244, and that a peripheral portion of each of the connectors contacts the case main body 24 and the bottom plate 26.

In addition, it is necessary to remove beforehand the resist coated on a peripheral portion of the lower-surface-side ground layer 11b of the circuit substrate 11, so that the bottom plate 26 can be electrically connected to the shield line 27.

The hot terminals of the connectors 131 and 132 projecting from the through holes 243 and 244 are soldered to the patterns 112 and 113 of the circuit substrate 11, respectively. Thus, the hot terminal of the connector 131 functions as a microwave signal input terminal, and that of the connector 132 as a microwave signal output terminal.

Figure 4C:
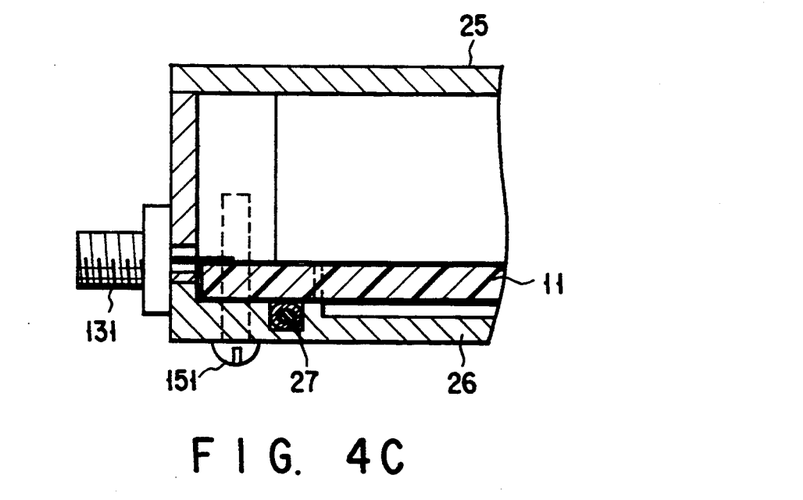
FIG. 4C is a sectional side view, showing the microwave amplifier having been assembled.

After soldering of the connectors 131 and 132, the top plate 25 is adhered to the upper surface of the case main body 24 by means of a shield resin, thus completing the assembling. FIG. 4C shows the completed device.

The advantage of the above-described structure will be explained.

When the bottom plate 26 is screwed to the case main body 24 with the circuit substrate 11 interposed therebetween, the shield line 27 is deformed and hence presses the substrate 11 against the main body 24, since the diameter of the line 27 is greater than the depth of the groove 265. As a result, the main body 24 can be brought into reliable contact with the ground patterns 114 and 115, formed on peripheral portions of the substrate 11, without a clearance therebetween, even if the substrate 11 is warped or the patterns 114 and 115 have uneven surfaces. Accordingly, external noise can be prevented from entering through the contact portion, and the contact resistance can be prevented from increasing, thereby enabling the potential of the main body 24 to be identical to that of each of the ground patterns 114 and 115.

Since the shield line 27 is provided on the side of the bottom plate 26, it can be formed along the entire periphery of the plate 26 without considering the pattern on the circuit substrate 11. This can reliably eliminate the conventional disadvantage that external radio noise enters in the vicinity of the patterns 111 and 112. Moreover, since it is not necessary to bury the shield line 27 on the side of the case main body 24, the thickness of the side walls of the body 24 can be reduced to a minimum value required to screw the bottom plate 26 and the substrate 11 to the body 24, thereby reducing the weight.

In addition, the shield line 27 comprises wound conductive threads, and the contact area between the lower-surface-side ground layer 11b of the substrate 11 and the bottom plate 26 is increased due to deformation of the threads caused when the overall components are assembled. Therefore, the ground layer 11b of the substrate 11 and the bottom plate 26 can have the same potential in a reliable manner.

Further, the upper-surface-side ground patterns 114 and 115 and the lower-surface-side ground layer 11b of the substrate 11 are connected to one another through the through hole 11a, and the case main body 24 and the bottom plate 26 contact each other at their peripheral portions. Further, each of the connectors 131 and 132 is secured to the main body 24 and the bottom plate 26. As a result, the body 24, the bottom plate 26, the ground patterns 114 and 115 and ground layer of the substrate 11 can have the same potential as the ground electrodes of the connectors 131 and 132.

Although in the above embodiment, the ground layer 11b is formed on the overall lower surface of the substrate 11, the ground layer 11b may be formed only on the periphery of the surface of the substrate 11, and have a minimum width enough to contact the shield line 27. On the contrary, where the ground layer 11b is formed on the overall lower surface of the substrate 11, the shielding effect is not changed even when that portion of the bottom plate 26 which is located inside the shield-line-buried groove 265 is cut out. In this case, the device is lightened by the weight of the cut-out portion.

Figures 5A, 5B:
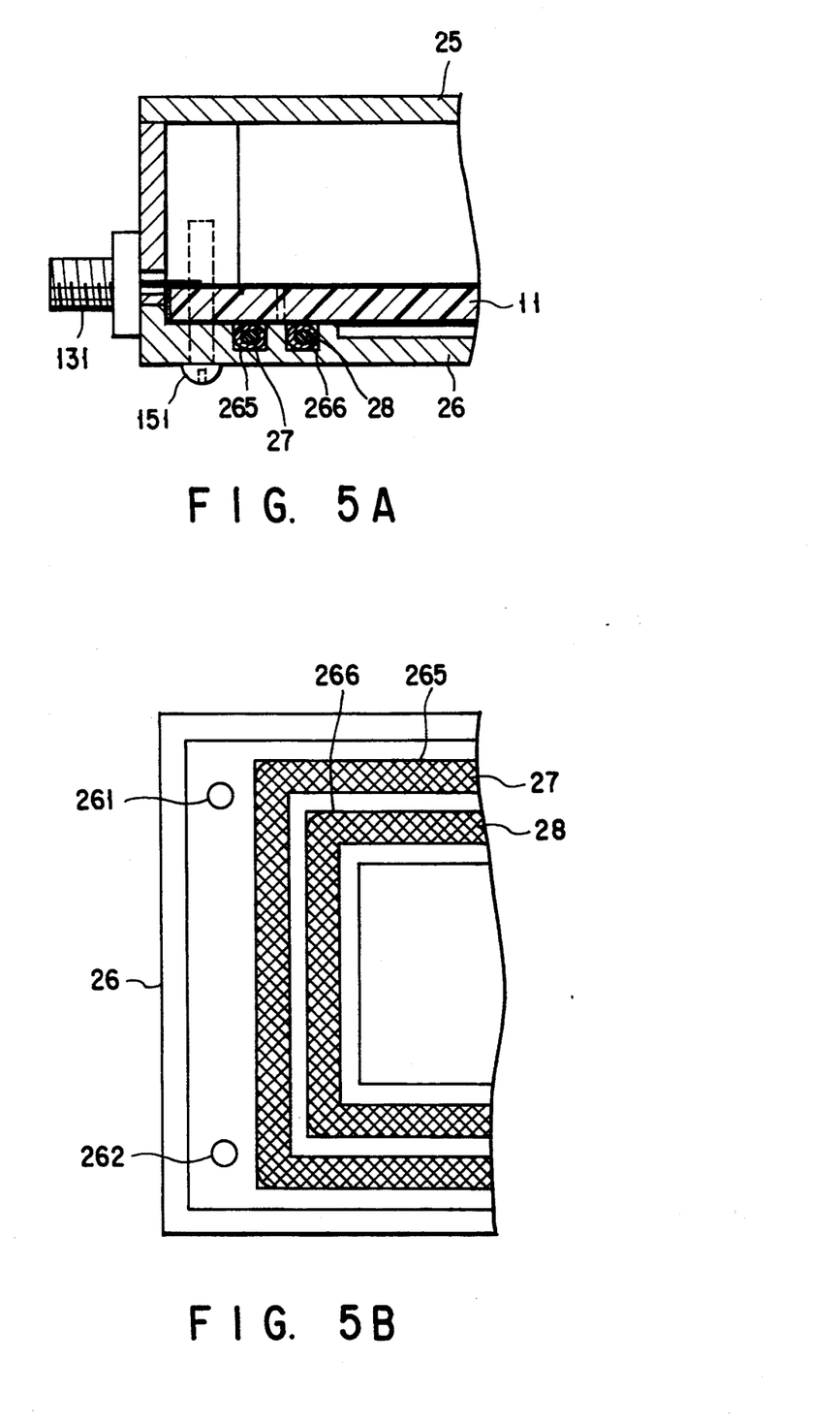
FIGS. 5A and 5B are a sectional side view and a plan view, showing a structure according to another embodiment of the invention, which employs a double shield line.

Furthermore, although a single shield line is employed in the above embodiment, a further groove 266 may be formed inside the groove 265 in that surface of the bottom plate 26 which contacts the substrate, and a second shield line 28 be buried therein, so as to establish more reliable shielding, as is shown in FIGS. 5A and 5B.

Figure 6:
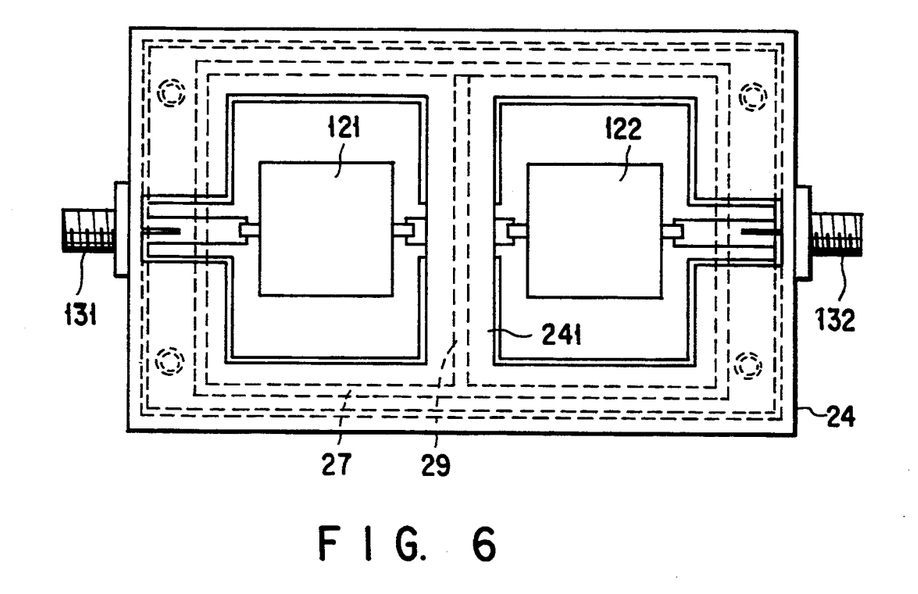
FIG. 6 is a plan view, showing a further embodiment of the invention, which employs a shield line provided in a central portion thereof.

More reliable contact can be established between the substrate 11 and the bottom plate 26, thereby increasing the shielding effect and decreasing the contact resistance, as a result of a structure shown in FIG. 6. Specifically, the thickness of a central portion of the bottom plate 26 is increased so as to contact the circuit substrate 11; and a groove with a shield line 29 buried therein is formed in the contact portion.

Figure 7A:
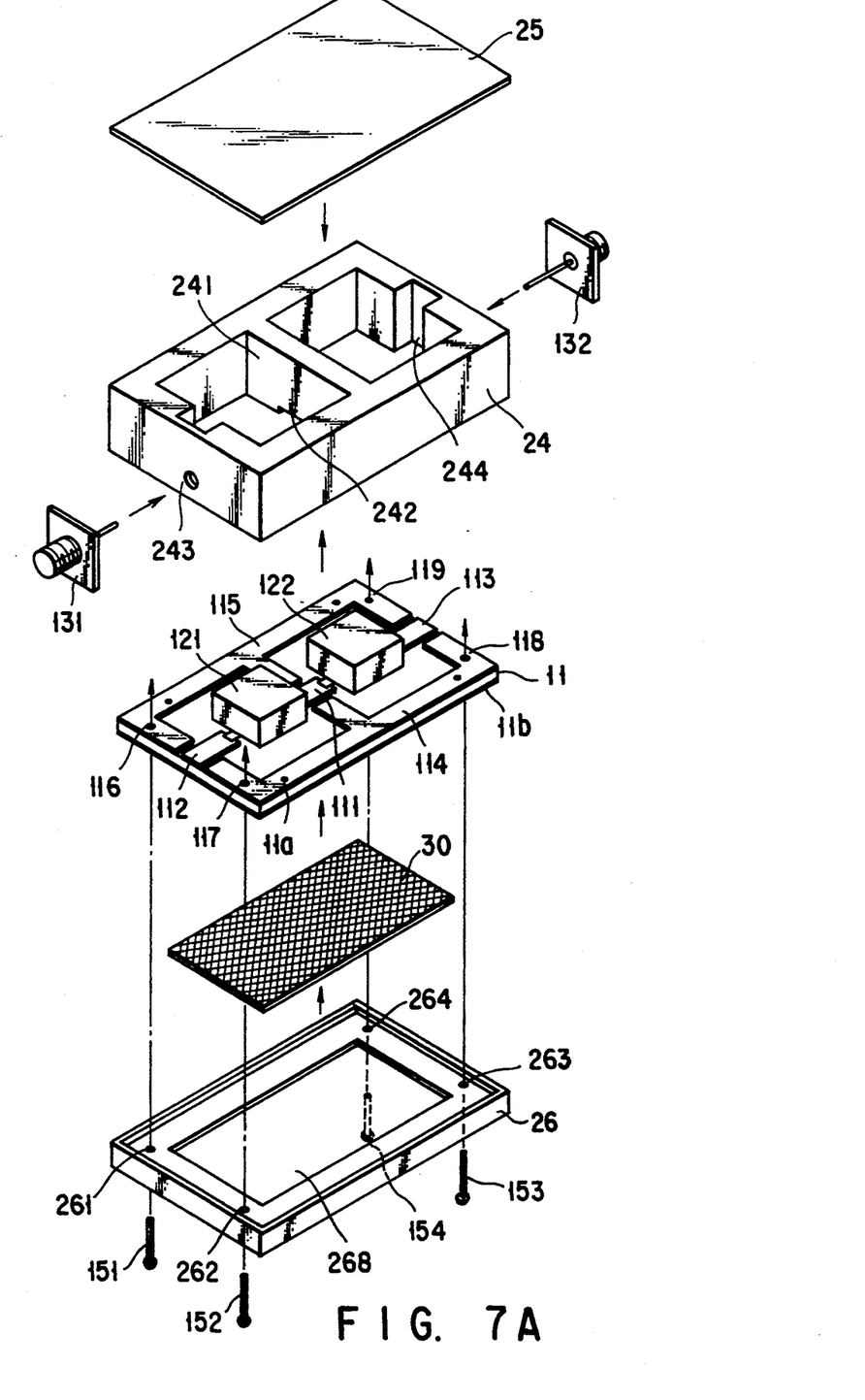
FIG. 7A is an exploded perspective view.
Figure 7B:
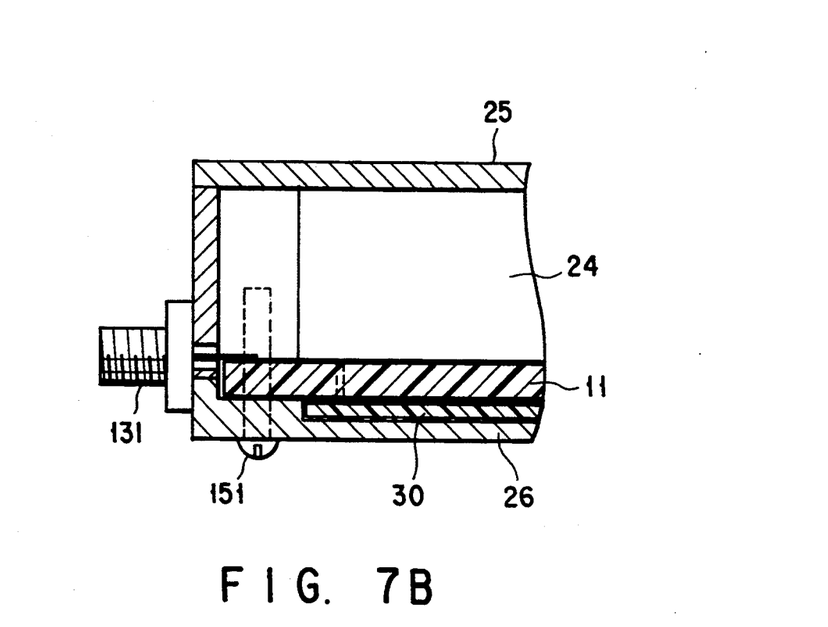
FIG. 7B is a sectional side view.

FIGS. 7A and 7B show a microwave amplifier according to another embodiment of the invention; wherein FIG. 7A is an exploded perspective view, and FIG. 7B is a sectional side view. In FIGS. 7A and 7B, elements similar to those shown in FIGS. 4A and 4B are denoted by corresponding reference numerals, and no explanations will be given thereof.

The structure of FIGS. 7A and 7B differs from that of FIGS. 4A and 4B in the following points:

The groove 265 and the shield line 27 are not employed. Instead, that portion 268 of the bottom plate 26 which is inside the screw holes 261-264 is made thinner than the other portions, thereby forming a receiving portion 268 in which a shield sheet 30 having a thickness slightly greater than the depth thereof is received.

The shield sheet 30 consists of an elastic conductor covered with threads of, for example, a resin, copper or aluminum. No resist layers are coated on the lower-surface-side ground layer 11b of the circuit substrate 11.

When the bottom plate 26 constructed as above is screwed to the case main body 24 with the substrate 11 interposed therebetween, the elastic shield sheet 30 is brought into tight contact with the lower-surface-side ground layer 11b of the substrate and the bottom of the receiving portion 268 of the bottom plate 26. In this case, the contact area is large, and hence the contact resistance can be ignored. Further, since the sheet 30 is made of a metal, it is free from cracking and aged deterioration when being screwed to the bottom plate 26 and the case main body 24 with the substrate 11 interposed therebetween.

Although in the above embodiments, each of the shield lines 27 and 28 and the shield sheet 30 is an elastic conductor consisting of a resin member and copper threads wound on the resin member, the conductor is not limited to this, but may be a member consisting only of copper threads, or a member obtained by working a copper plate. In other words, it suffices if the elastic conductor can provide good electrical contact and tight contact between the circuit substrate and the bottom plate of the shield case.

The shield structure of the invention is applicable not only to a microwave amplifier, but also to microwave circuit devices of other types.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A shield structure for shielding a microwave circuit device, comprising:

a circuit substrate having microwave components and wires provided on one surface, and a ground layer formed at least on a peripheral portion of the other surface;

a main case body and a bottom plate made of an electrically conductive material, and detachably coupled with each other to hold the circuit substrate from both sides with the microwave components electrically isolated from outside, at least one hole being formed in a surface perpendicular to the circuit substrate of said main case body; and a connector for connecting the circuit substrate to an external device, the connector having a conductive envelope, and a central conductive member isolatedly projecting from the conductive envelope, the central conductive member being inserted through the hole without contacting the same and thus connected to wires of the circuit substrate, thereby attaching the envelope to said main case body with the hole sealed;

wherein said bottom plate is engaged with the other surface of the circuit substrate; at least one first continuous annular groove which extends at least along a periphery portion of the circuit substrate is formed in a surface of said bottom plate, which is opposed to the circuit substrate; and at least one elastic and conductive shield line member having a diameter greater than a depth of the at least one first continuous groove is buried therein so that the shield line member can tightly contact the ground layer formed on the other surface of the circuit substrate, where said main body and said bottom plate are coupled.

2. The shield structure according to claim 1, further comprising:

a second continuous annular groove not being superposed and not overlapping with said first continuous annular groove, and wherein shield line members are disposed in said first and second continuous annular grooves.

3. The shield structure according to claim 1, wherein the ground layer is formed all over the other surface of the circuit substrate, and said bottom plate has a center hole.

4. A shield structure for shielding a microwave circuit device comprising:

a circuit substrate having microwave components and wires provided at one surface thereof, and a ground layer formed all over the other surface thereof;

a main case body and bottom plate made of an electrically conductive material, and detachably coupled with each other to hold the circuit substrate from both sides with the microwave components electrically isolated from outside, at least one hole being formed in that surface perpendicular to the circuit substrate of said main case body; and a connector for connecting the circuit substrate to an external device, the connector having a conductive envelope and a central conductive member isolatedly projecting from the conductive envelope, the central conductive member being inserted through the hole without contacting the same and thus connected to the circuit substrate, thereby attaching the envelope to said main case body with the hole sealed;

wherein said bottom plate is engaged with the other surface of the circuit substrate; a shield sheet is provided on that surface of said bottom plate, which is opposed to the circuit substrate; and the shield sheet can tightly contact the ground layer formed on the other surface of the circuit substrate, where said main case body and said bottom plate are coupled.

5. A shield structure for shielding a microwave circuit device from noise, comprising:

a top plate made of an electrically conductive material;

a main body made of an electrically conductive material and having an opening through said main body for housing said microwave circuit device, said main body having a top and bottom, wherein said top and bottom are opposed through ends of said opening;

a substrate made of an electrically insulated material and having a periphery, said substrate supporting said microwave circuit device on a first major surface and having a first bottom plate made of an electrically conductive material formed completely on a second major surface;

a wiring pattern on said first major surface of said substrate connected to said microwave circuit device and extending to said periphery of said substrate for serving as a contact pad;

a ground pattern made of an electrically conductive material formed on said first major surface adjacent the periphery of said substrate and not being in contact with said wiring pattern;

a second bottom plate made of an electrically conductive material and having a continuous-loop shield line disposed in a groove formed in the second bottom plate, said groove following a path adjacent an outer periphery of said second bottom plate;

said top plate covering and completely sealing the top of said main body;

said substrate fitted onto and completely covering the bottom of said main body with said microwave circuit device extending into said opening of said main body;

said second bottom plate fitted on the first bottom plate;

said shield line extending out of the groove and contacting said first bottom plate made of an electrically conductive material of said substrate; and said top plate, said main body, said ground pattern, said first and said second bottom plates being connected to form said shield structure for shielding said microwave circuit device from noise.

6. The shield structure according to claim 5, wherein:

said top plate is in direct contact with said main body;

said main body rests on top of and is in direct contact with said ground pattern of said substrate;

said ground pattern is electrically connected to said conductive material formed on said second major surface of said substrate through a hole in said substrate;

said first bottom plate is in direct contact with said second bottom plate; and said top plate, said main body, said ground pattern and said second bottom plate being connected to form one continuous electrical ground plane to prevent differences in potential from arising in the shield structure and to prevent noise arising from said differences in potential.

7. The shield structure according to claim 6, wherein said second bottom plate has an opening therethrough which borders said continuous-loop shield line at every point.

8. The shield structure according to claim 7, wherein said second bottom plate further comprises:

a lip extending along an entire perimeter of said second bottom plate and forming a recess in the second bottom plate inside the lip, said recess receives said substrate; and said substrate fitting exactly within said recess.

9. The shield structure according to claim 7, further comprising:

a partition within the main body separating distinct regions of the opening for providing shielding between a plurality of microwave circuit devices formed on said substrate.

10. The shield structure according to claim 9, further comprising:

first and second microwave circuit devices connected by said wiring pattern; and said ground pattern on said substrate including first and second E-shaped patterns which are positioned around said first and second microwave circuit devices, said first and second E-shaped patterns not in contact with said wiring pattern and said first and second microwave circuit devices.

11. The shield structure according to claim 6, further comprising:

connecting means for connecting the wiring pattern to circuitry external to said main body;

12. The shield structure according to claim 11, wherein said connecting means further comprises:

a shielded coaxial connector having an electrically conductive envelope and a central conductive wire; and said connecting means entering said shield structure through a hole and connecting said central conductive wire to said wiring pattern at said periphery of said substrate.

* * * * *